(12) United States Patent
Sullivan

(10) Patent No.: US 6,639,476 B1
(45) Date of Patent: Oct. 28, 2003

(54) CORRELATOR STABILIZED DIGITALLY TUNED OSCILLATOR SYNTHESIZER

(76) Inventor: William B. Sullivan, P.O. Box 289, Rockaway, NJ (US) 07866

(*) Notice: Subject to any disclaimer, the term of this patent is extended or adjusted under 35 U.S.C. 154(b) by 0 days.

(21) Appl. No.: 10/139,810

(22) Filed: May 7, 2002

(51) Int. Cl.[7] ................................................ H03L 7/06
(52) U.S. Cl. ........................................ 331/17; 331/105
(58) Field of Search ........................ 331/17, 2; 327/105, 327/106, 107; 375/376

(56) References Cited

U.S. PATENT DOCUMENTS

| | | | |
|---|---|---|---|
| 4,185,247 A | * 1/1980 | Harrison, Jr. | 327/107 |
| 5,563,535 A | * 10/1996 | Corry et al. | 327/105 |
| 6,268,780 B1 | * 7/2001 | Olgaard et al. | 332/117 |
| 6,380,810 B1 | * 4/2002 | Sutton | 331/17 |

* cited by examiner

Primary Examiner—Timothy P. Callahan
Assistant Examiner—Linh Nguyen
(74) Attorney, Agent, or Firm—Zachary T. Wobensmith, III (57) ABSTRACT

A digitally tuned oscillator synthesizer having a correlator circuit and selectable voltage controlled oscillators is disclosed. The correlator circuit develops an accurate output which provides frequency stability for the synthesizer, whereas the voltage oscillators each operate over less than an octave of a desired RF frequency output, but cooperatively operate to produce RF outputs over a wide range of frequencies.

11 Claims, 5 Drawing Sheets

CORRELATOR STABILIZED DIGITALLY TUNED OSCILLATOR SYNTHESIZER

BACKGROUND OF THE INVENTION 1.0 Field of the Invention

The present invention relates to a RF (Radio Frequency) synthesizer and, more particularly, to an RF synthesizer having a correlator circuit that provides long term frequency stability for the RF synthesizer.

2.0 Description Related to the Prior Art

There are many types of RF (Radio Frequency) synthesizers in present use. These fall into one of four general categories: Phase Locked, YIG tuned, Direct Digital, and Digitally Tuned Oscillator. The phase locked synthesizer usually employs a Voltage Controlled Oscillator (VCO) that is phase locked to some fixed low frequency reference oscillator via a frequency divider circuit. The output frequency of the phase locked synthesizer is adjusted by changing the divider circuit characteristics. The phase locked synthesizer design is usually complex, as the frequency divider circuits are required to divide by non-integer ratios, and exhibits the frequency stability of the fixed low frequency reference, and, because of the narrow video bandwidths of the phase lock circuit, the phase locked synthesizers tend to be slow in its response (1 ms to 10 ms, typically).

The YIG (Yittrium Iron Garnet) tuned synthesizer provides a wide band (usually up to an octave relative to the input frequency) RF output, and is based on an oscillator using a YIG sphere as a resonator, and is tuned by changing the magnetic field applied to the YIG. The accuracy of the YIG tuned synthesizer is poor (typically 0.1% of the output frequency, ±18 MHz at 18 GHz). In addition, the tuning time is relatively slow (100 mS).

The direct digital synthesizer generates an RF output by sequencing through a series of addresses accessed from a RAM (Random Access Memory) that has previously been loaded with a mathematical sine function. The direct digital synthesizer produces a relatively fast RF output, but is limited in frequency resolution and bandwidth. The digitally tuned oscillator consists of a VCO that is digitally tuned, using a Programmable Read Only Memory (PROM) calibration table, to compensate for the nonlinear tuning characteristics of the VCO. To reduce the output frequency error over temperature, the VCO is often oven stabilized. While this produces a fast response (<10 $\mu$S), achievement of output frequency accuracies on the order of 1 MHz requires extensive calibration. Further, the oven stabilization leads to a long term frequency drift, requiring occasional recalibration. It is desired to provide a RF synthesizer that does not suffer the drawbacks of the prior art. More particularly, it is desired to provide a RF synthesizer having a high speed, and a broad band, and serves as an accurate signal source having long term frequency stability.

OBJECTS OF THE INVENTION

It is an object of the present invention to provide an RF synthesizer having a quick response, and a broad band, and provides an accurate signal source having long term frequency stability.

It is another object of the present invention to provide an RF synthesizer having a correlator that provides the RF synthesizer with long term stability.

It is still another object of the present invention to provide broad band frequency dividers that operatively cooperate with the correlator to provide long term frequency stability for the RF synthesizer.

SUMMARY OF THE INVENTION

The invention is directed to a digitally tuned synthesizer having a frequency measurement circuit, which includes a correlator that provides long term frequency stability to the synthesizer.

The digitally tuned synthesizer comprises: register means for receiving digital word having a predetermined number of bits; means interconnected to said register means for partitioning the predetermined number of bits of the digital word into coarse and fine control words; a first digital to analog converter connected to the coarse control word and providing an output representative of the coarse control word; at least one voltage controlled oscillator having first and second inputs with the first input connected to the output of the first digital to analog converter and providing a RF output representative of its first and second inputs. The digitally tuned synthesizer further comprises a frequency measurement circuit connected to the output of the at least one voltage controlled oscillator and providing an output representative thereof; a first adder having plus (+) and minus (−) inputs. The plus (+) input being connected to the fine control word. The minus (−) input being connected to the output of said frequency measuring circuit. The adder has an output representative of the difference between its inputs. The digitally tuned synthesizer further comprises a second digital to analog converter connected to the output of the first adder and providing an output representative thereof that is connected to the second input of the at least one voltage controlled oscillator.

DETAILED DESCRIPTION OF THE DRAWINGS

A better understanding of the present invention may be realized by considering the following details and description, taken in conjunction with the accompanying drawings wherein.

DETAILED DESCRIPTION OF THE PREFERRED EMBODIMENTS

Figure 1:
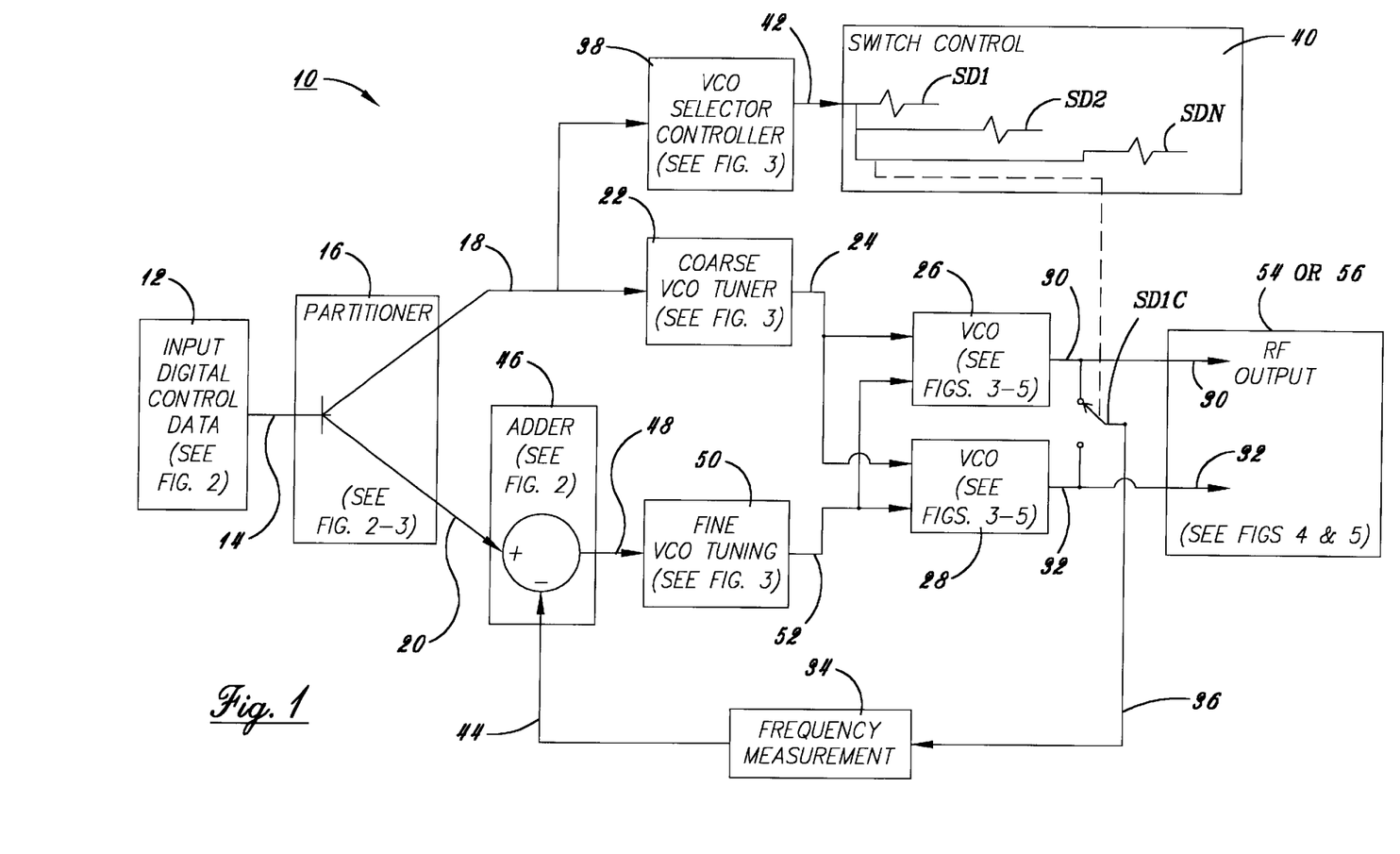
FIG. 1 is a block diagram of the RF synthesizer of the present invention.
Figure 3:
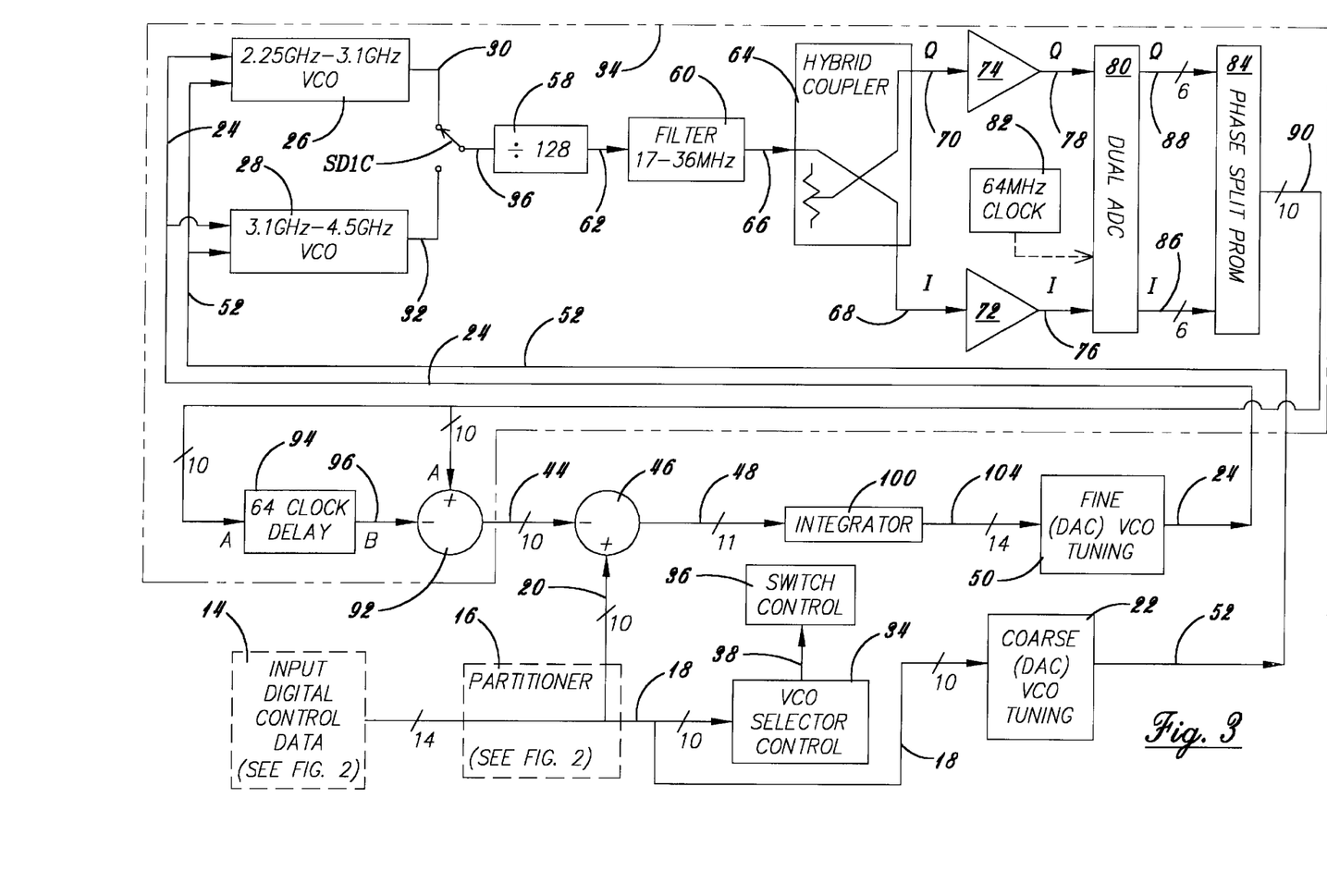
FIG. 3 primarily illustrates the frequency measuring circuit of the present invention.

With reference to the drawing, wherein the same reference number indicates the same element throughout, there is shown in FIG. 1 a block diagram of a radio-frequency (RF) synthesizer 10. The RF synthesizer 10 includes means, such as a register 12 for receiving a digital word having a predetermined number of bits. The register 12 is interconnected to a partitioner 16, which segments the predetermined number of bits of the digital word 14 into coarse and fine control words 18 and 20 respectively. The coarse control 18 is routed to the coarse voltage control oscillator (VCO) tuner 22 primarily consisting of a digital to analog converter, which provides an output on signal path 24. The coarse VCO tuner 22, as well as the fine VCO tuner 50, to be described hereinafter, may be interchangeably referred to herein as simply a digital to analog converter. Further, as used herein and as shown in FIG. 3, the number of bits present on a signal path is indicated by a slash (/) followed by a number.

The RF synthesizer 10 further includes at least one, preferably two, voltage controlled oscillators (VCO) 26 and 28, both of which receive the output of the coarse VCO tuner 22 on signal path 24. VCO 26 provides an output signal on signal path 30, whereas VCO 28 provides an output signal on signal path 32. The selection of which signal path 30 or 32 is applied to the frequency measuring circuit 34, by way of signal path 36, is determined by the operation of the voltage control oscillator (VCO) selector controller 38.

The VCO selector controller 38 may be a PROM that is programmed to have a lookup table with stored values. The VCO selector controller 38 receives the coarse control word 18 and if that control word 18 is less than a predetermined quantity, it activates the switch control 40, by way of shared signal path 42, so as to energize a switching device SD1. The switching device, SD1 may serve to provide a switching function, such as, a relay contact schematically shown as SD1C connected to the outputs of the VCOs 26 and 28. The switching device, SD1, has open and closed states to provide breaking and making contacts and transitioning between open and closed states. For one application, upon the activation of SD1, its contact SD1C is activated breaking its connection from signal path 30 and making a connection to signal path 32. The VCO selector controller 38 also controls, in response to predetermined values embodied in the coarse control word 18, via shared signal path 42, other switching elements SD2 . . . SDN, which will be further described hereinafter with reference to FIGS. 4 and 5.

The frequency measurement circuit 34 is connected to the output of one of the VCOs 26 and 28 and provides an output representative thereof, that is placed on signal path 44, which is routed to the (−) minus input of a first adder 46 having applied thereto on its (+) positive input, the fine control word 20. The first adder 46 provides an output on signal path 48, which is representative of the difference between its positive (+) and minus (−) inputs and which signal path 48 is routed to the fine voltage control oscillator (VCO) tuner circuit 50 primarily comprised of a digital to analog converter. The digital to analog converter 50 provides an output signal on signal path 52, which is representative of its received input from the first adder 46. The output of the digital to analog converter 50 is connected to the input of both of the VCOs 26 and 28. The VCOs 26 and 28 provide for an RF output on signal paths 30 and 32, respectively, for first and second embodiments 54 and 56, to be further described with reference to FIGS. 4 and 5. The VCOs 26 and 28 are digitally tuned devices responsive to input digital controlled data that may be further described with reference to FIG. 2.

Figure 2:
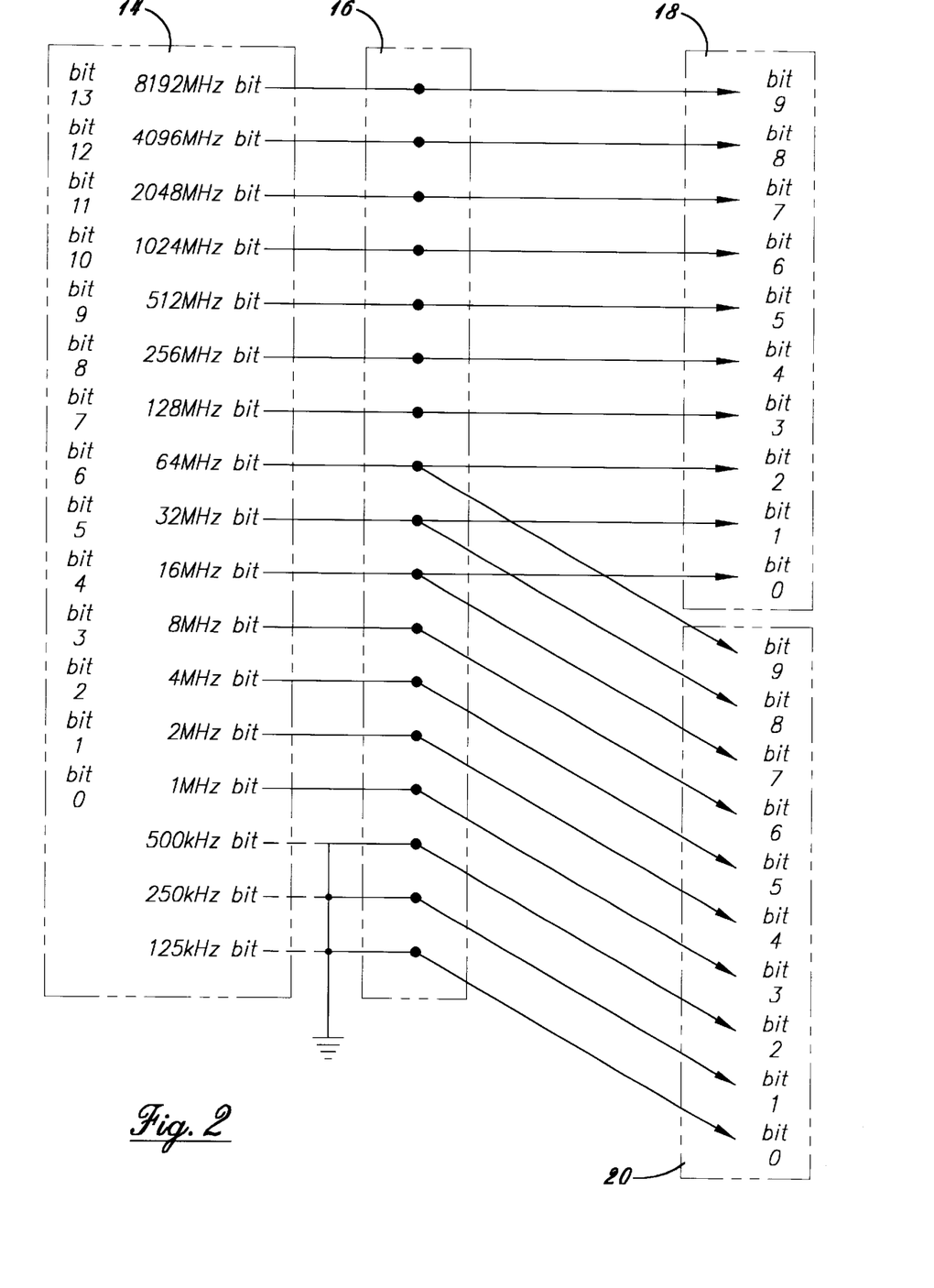
FIG. 2 illustrates a typical format of the digital words including the input data and the coarse and fine control words.

FIG. 2 illustrates the input control data 14, the partitioner 16, the coarse tuning control word 18, and the fine tuning control word 20. For the embodiment shown in FIG. 2, a 14-bit digital control word is used for the input control data 14 providing 16,384 MHz unambiguous coverage with a 1 MHz resolution. This 14 bits of digital information covers a range of 2.25 GHz to 18 GHz to be further described with reference to FIGS. 4 and 5. The partitioning or segmenting the input control data 14 into the coarse tuning control word 18 and the fine tuning control word 20 is accomplished by the partitioner 16 which may simply be a terminal board with the appropriate wiring to provide interconnections between the input control data 14, the coarse tuning control word 18 and the fine tuning control word 20. The means for receiving the input control data 14 may simply be the register 12. The ten most significant bits (MSB) of the input control data 14 are provided for tuning the coarse VCO tuner 22 with 16 MHz resolution. These ten most significant bits make up the coarse control word 18. The four least significant bits (LSB) of the 14-bit control input 14 have three "zero" bits appended, which is accomplished by way of the ground connection shown in FIG. 2. The ten least significant bits of the input control data 14 make up the fine control word 20. The unambiguous bandwidth of the fine tuning, defined by the bits 3–9 of fine control word 20, is 128 MHz (or, ±64 MHz), allowing for substantial uncertainty in the VCO coarse tuner 50 handled by the coarse control word 18. Note that additional input tuning resolution (in 125 KHz steps) is available, simply by extending the input control word 14 to finer resolution, that is, make utilization of bits 2, 1, and 0 of fine control word 20 respectively shown in phantom as 500 kHz bit, 250 Khz bit, and 125 KHz bit. The stability of the RF synthesizer 10 is primarily provided by the frequency measuring circuit 34 of FIG. 3.

In general, the frequency measuring circuit 34, to be further discussed hereinafter with reference to FIG. 3, operatively includes a correlator having a signal of interest that is compared against itself, but delayed by a predetermined duration established by a clock, and delivers an output on signal path 44 that is proportional to the correspondence between a signal of interest and the signal of interest delayed by the predetermined duration.

In operation and with reference to FIG. 1, the input digital control word 14 is loaded into the register 12. The coarse VCO tuner 22 initially, such as occurring during turn on of the RF synthesizer 10, establishes the VCO output frequency provided by VCO 26 or VCO 28 typically in 16 MHz steps which corresponds to bit 0 (see FIG. 2) of the coarse tuning control word 18. The coarse VCO tuning 22 output is then held constant.

The coarse tuned VCO frequency, provided by either VCO 26 or VCO 28, is then measured by the frequency measurement circuit 34 in a manner to be further described hereinafter with reference to FIG. 3. The output of the frequency measurement circuit 34 is delivered to the first adder 46 by way of signal path 44.

The digital output of the frequency measurement circuit 34 is compared by the first adder 46 to the fine control word 20; the difference therebetween is provided on signal path 48 to fine control the fine VCO tuner 50. The output of the fine VCO tuner 50 is presented on signal path 52 and is delivered, along with the output of the coarse VCO tuner 22, present on the signal path 24, to both of the VCOs 26 and 28. The feedback loop of the RF synthesizer 10 is now closed and the VCO frequency provided by either VCO 26 or VCO 28 will be held at that value which minimizes the error or difference between the frequency measured by the frequency measuring circuit 34, (+) input of first adder 46, and the fine control word 20, (−)input of the first adder 46.

The RF synthesizer 10, having the benefit of the frequency measuring circuit 34 shown in detail in FIG. 3, provides multiple octave output frequency coverage, while controlling harmonic and spurious outputs yielded by the pair of VCOs 26 and 28. The low band VCO provided by VCO 26 covers 2.25 GHz to 3.1 GHz, whereas the high band VCO provided by VCO 28 covers 3.1 GHz to 4.5 GHz. As previously discussed with reference to FIG. 1, the selection of VCO 26 or VCO 28 is accomplished by the VCO selector control 38 and switch control 40.

As seen in FIG. 3, the combined low (VCO 26) and high (VCO 28) bands produce a 2.25 GHz to 4.5 GHz output frequency range that is applied (via contact SD1C) to signal path 36 which, in turn, is delivered to divider 58. This frequency range is divided 128 times by divider 58 using digital frequency dividers, to produce an RF output in the range from 17.578125 MHz to 35.15625 MHz. Divider 58 operates in a manner known in the art and also in a manner similar to frequency dividers and frequency multipliers to be further described hereinafter with reference to FIGS. 4 and 5.

The divided output of divider 58 is delivered to filter 60, by way of signal path 62. The filter 60 has a pass band from about 17 MHz to about 36 MHz and filters its input to produce a sinusoidal output that is delivered to a quadrature hybrid coupler 64 by way of signal path 66. The quadrature hybrid coupler 64 may be the type "90° Hybrids" made available by Pulsar Microwave Corporation of 48 Industrial West, Clifton, N.J. 07012. This sinusoid output of filter 60 is processed through the quadrature hybrid coupler 64, dividing the sinusoid input signal into in-phase (I) and quadrature (Q) components, respectively present on outputs path 68 and 70 which, in turn, are respectively delivered to amplifiers 72 and 74 which, in turn, provide outputs 76 and 78 that are delivered to a dual analog to digital converter 80.

The dual analog to digital converter 80 is known in the art, and is responsive to a clock signal with a predetermined frequency, more particularly, to a 64 MHz clock generated by clock generator 82. The dual analog to digital converter 80 receives the preferably amplified in-phase (I) and quadrature (Q) components and digitized them using the 64 MHz clock and respectively delivered the digitized signals to the phase split PROM 84 by way of signal path 86 and 88.

The phase split PROM 84, known in the art, produces an inverse tangent quantity derived from the ratio of the in-phase (I) and quadrature (Q) components and provides an output thereof on signal path 90, which is used to produce a serial sequence of phase measurements at the 64 MHz clock rate provided by clock generator 82. More particularly, the output signal path 90 is delivered to a correlator circuit comprised of a second adder 92 and a sixty-four (64) clock delay circuit 94.

In general, the signal present on signal path 90 serves as a signal of interest and this signal of interest is delayed by a predetermined duration. The cooperative operation of elements 92 and 94 provide an output, which comprises the output of the frequency measuring circuit 34, and which is proportional to the correspondence between the signal of interest and the signal of interest delayed by the predetermined duration. More particularly, the serial digitized phase data present on signal path 90 is sent along two paths; one path is delayed by 64 clock (1 $\mu$S) delay 94, and the second path is delivered to the positive (+) input of the second adder 92. Specifically, delaying signals having a clock rate of 64 MHz, sixty-four (64) times yields 1 $\mu$S delayed signals. The delayed digitized phase data is delivered, via signal path 96, to the minus (−) input of the second adder 92. The (+) positive input of the second adder 92 has serial digitized phase data connected thereto. The second adder 92 produces a serial result on its output 96 that corresponds to the difference in phase over a 1 $\mu$S interval. The output 96 is delivered to the first adder 46, which subtract the digital contents contained in the output 96 from the fine control word 20 so as to fine tune the selected VCO 26 or VCO 28, in a manner as previously described with reference to FIG. 1.

The frequency measuring circuit 34 of FIG. 3 operates on the principle that any constant VCO frequency will produce a constant phase difference over a 1 $\mu$S interval. For example, where the input frequency be 0 Hz, the output phase difference would be a constant zero. If the input frequency is 1 MHz, then, in 1 $\mu$S, exactly 360 degrees of phase difference will occur, as the delay period (1 $\mu$S) equals the input signal period 1 MHz. Accordingly, the frequency measurement circuit 34 exhibits a periodic digital data output with a 1 MHz period. More particularly, the in-phase (I) and quadrature (Q) quantities are digitized by a 64 MHz clock and then delayed sixty-four times using a 64 MHz clock, thus, yielding a period of 1 MHz. The accuracy of the frequency measurement circuit 34 is set by the accuracy of the 64 MHz clock, because the clock establishes the delay (1 MHz period). The frequency circuit 34 advantageously provides a digital implementation of a correlator.

The 1 MHz period of the frequency measurement circuit 34 begins at zero frequency, and continues through 36 MHz. The purpose of elements 60 through 84 of FIG. 3 is to provide a digital phase measurement of the instantaneous phase of the RF signal output of filter 66. This phase is sampled at a 64 MHz clock rate. The 10-bit output of the Phase Split PROM 90 is this digital phase measurement updated at a 64 MHz rate. The sampled phase is provided to the (+) input of an adder 92 and the delayed (by 1 $\mu$S) sampled phase is provided to the (−) input of the adder 92. The output of adder 92 is then the phase difference between the current phase measurement and the phase measurement from 1 $\mu$S previous, updated at the 64 MHz clock rate. Clearly, where the input to be 0 MHz (DC), the phase difference over 1 $\mu$S would be zero. Similarly, if the input RF frequency were exactly 1 MHz, then the phase difference over 1 $\mu$S would also be zero, as the two phases would be exactly the same. A similar result is obtained if the RF input frequency is exactly 2 MHz; the phase difference would be 720 degrees (2×360 degrees) and, because the difference output from the adder 92 repeats over 360 degrees, the difference output to a 2 MHz input would, again, be zero. This rationale continues over the range of the 17 MHz to 35 MHz RF input. At every integer multiple of 1 MHz, the phase difference is zero; as the; KF frequency is increased, with respect to an integer multiple of 1 MHz, the output of thy adder 92 increases, until the next integer multiple of 1 MHz is reached, where the phase difference again reverts to zero. In effect, then, the output of adder 92 is a phase difference measurement over a fixed time interval, which is another way of describing a frequency measurement.

The 14-bit input control data word 14, with a 1 MHz resolution, provides unambiguous coverage of 15,384 MHz. If the digitally tuned RF synthesizer 10 of the present invention was desired to just provide a maximum output frequency that is less than 16,384 MHz, then the input control word 14 would be just as described but, because the hereinbefore described digitally tuned synthesizer 10 was selected to provide a 2.25 GHz to 18 GHz output, an offset is added to the input control word 14, to shift the coverage to the desired range.

As previously discussed, the 14-bit input control word 14 is partitioned into a 10-bit coarse tuning word 18 and a 10-bit fine tuning word 20 (including 3-bits appended as zero), with 2-bits shared. With reference to FIG. 2, it is observed that the Most Significant Bit (MSB) of the fine tuning data contained in fine tuning control word 20 is the 64 MHz bit of the input control word. Since the frequency measurement circuit 34 exhibits a period of 1 MHz, the MSB of the fine tuning word 20 (bit 9) is 0.5 MHz. The frequency measurement circuit 34, with a 1 MHz period, is preceded by a 128 divider 58. Taking into account the divider 58, the MSB of the fine tuning word 20 corresponds to the 64 MHz bit of the input control word.

The digitized output of the second adder 92 is presented on signal path 44, which is actually the output of the frequency measuring circuit 34. The output of the frequency measuring circuit 34 is subtracted from the fine control word 20. The subtraction is accomplished by the first adder 46, previously described with reference to FIG. 1, and then produces an error signal on signal path 48. The error signal on signal path 48 is preferably integrated by integrator 100 to produce a second order control loop, accurately setting the selected VCO 26 or VCO 28 to its desired frequency.

It should now be appreciated that the practice of the present invention provides for a RF synthesizer employing dual voltage control oscillators, each operating over less than an octave. The RF synthesizer employs a correlator to generate an error signal to provide for long term frequency stability for the RF synthesizer. The correlator is responsive to the development of in-phase (I) and quadrature (Q) components that have been digitized and manipulated by a phase split PROM to generate a serial stream of digital data which provides for an accurate frequency measurement which, in turn, provides for the long term frequency stability of the RF synthesizer.

Although the RF synthesizer has been described using two VCO 26 and 28, one VCO may be provided if it yields the desired frequency range from about 2.25 GHz to about 4.5 GHz.

Figure 4:
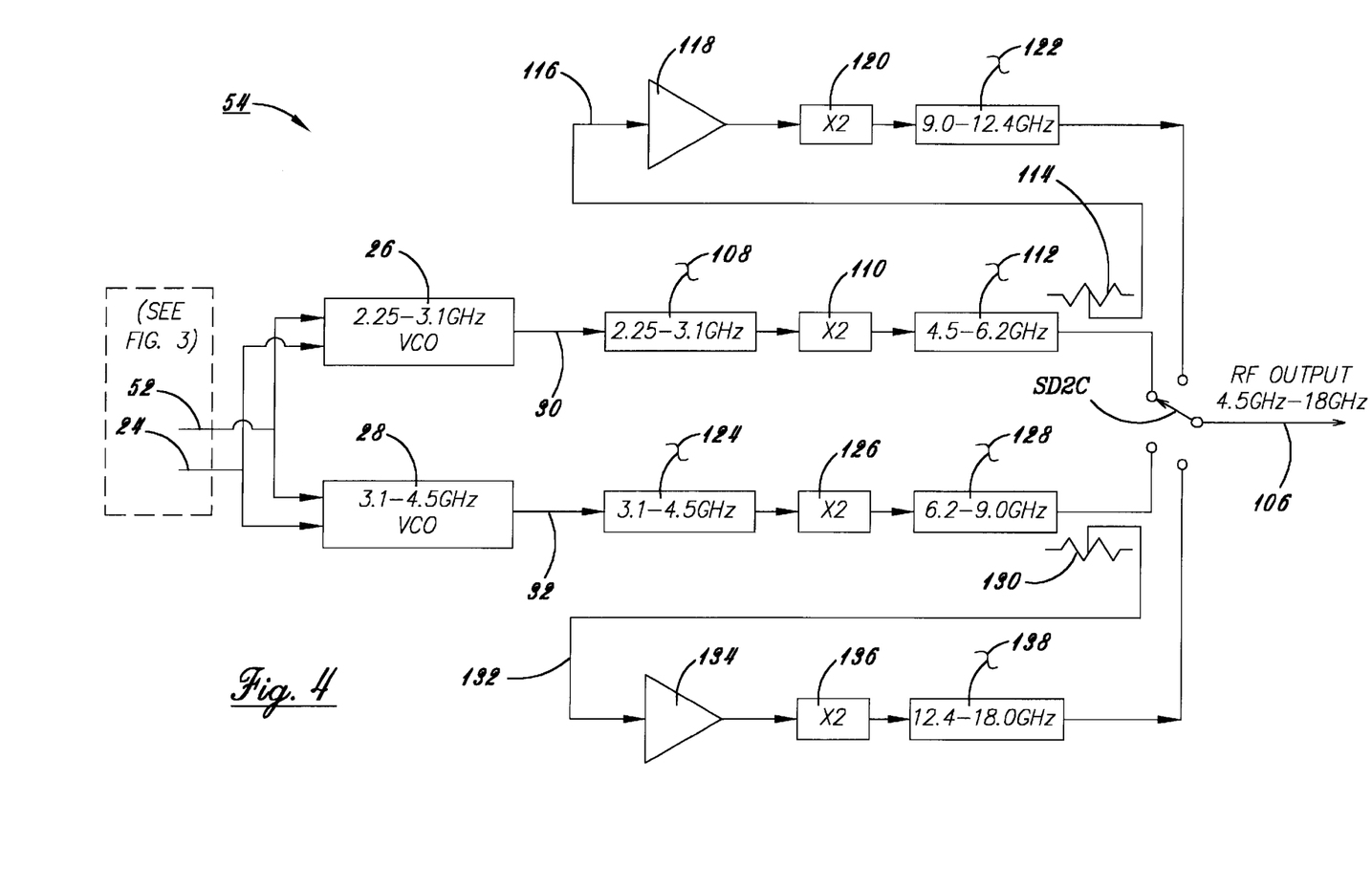
FIG. 4 illustrates one embodiment for obtaining a plurality of RF outputs utilizing frequency multipliers.
Figure 5:
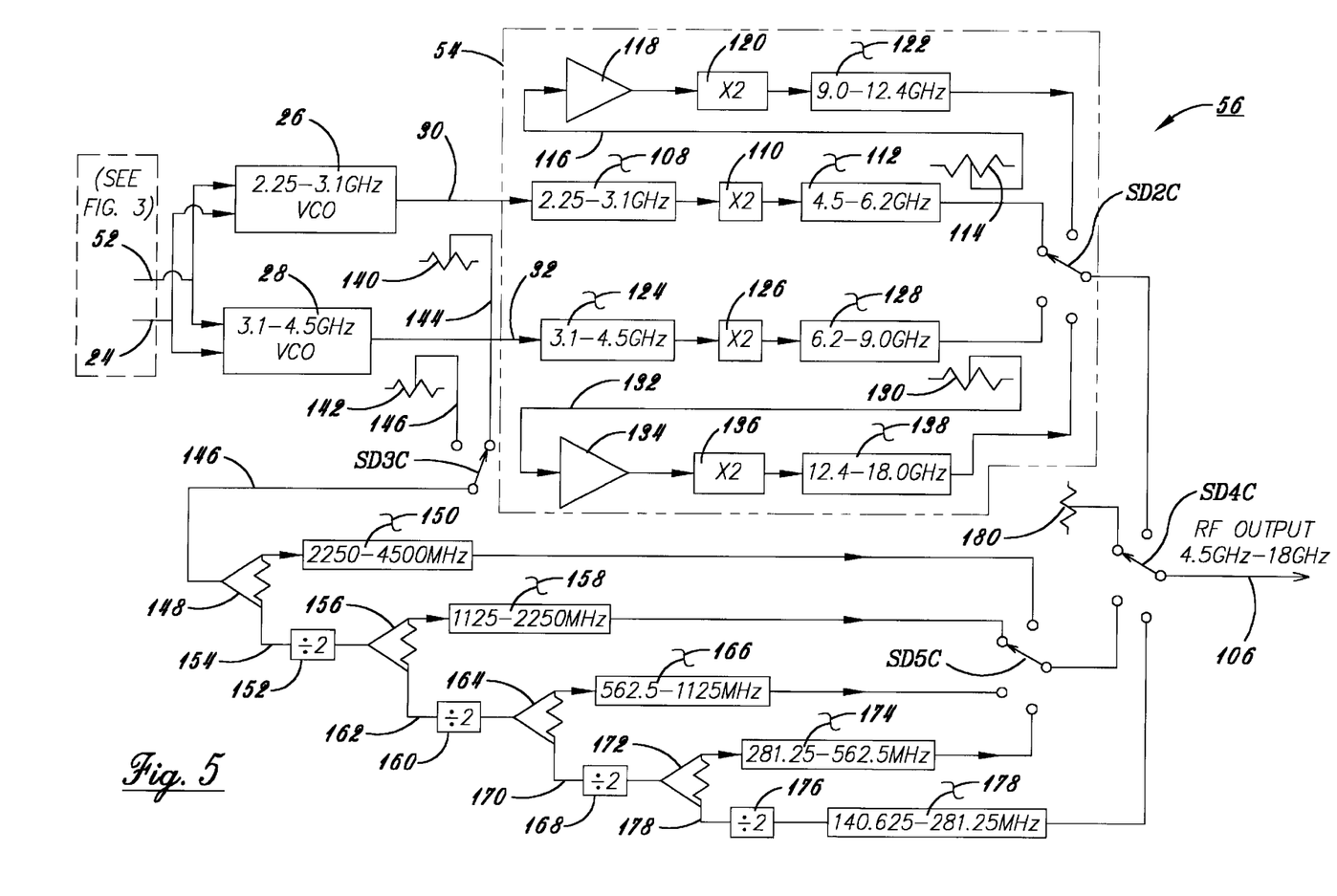
FIG. 5 illustrates a block diagram using a plurality of frequency multipliers with frequency dividers so as to obtain a wide band of RF outputs.

The digitally tuned synthesizer 10 of the present invention comprises a series of frequency multipliers and frequency dividers selectively connected to the outputs of VCO 26 and VCO 28 so as to provide RF signals in the range from about 17 MHz to about 18 GHz and such may it further describe with reference to the embodiments 54 and 56 of FIGS. 4 and 5, respectively.

FIG. 4 shows the output of the VCOs 26 and 28 directly connected to a plurality of frequency multipliers and the embodiment 54 as having an output 106. The output of VCO 26, that is, signal path 30, carries a sinusoidal signal 108 having a frequency range shown in FIG. 4, which is delivered to a frequency multiplier 110 which multiplies the received frequency by two and provides an output signal 112 having a frequency range shown in FIG. 4. The signal 112 is made available as the output 106 of embodiment 54 by way of the switching element SD2C, which is a contact of switching device SD2 which, in turn, is controlled by the VCO selector controller 38, in a manner as previously described with reference to FIG. 1. In general, the VCO selector controller 38 may contain a routine having predetermined knowledge of what frequency the RF synthesizer desires to output and according activate the appropriate switching device SD2 . . . SDN. More particularly, the coarse tuning control word 18 is provided to the VCO Selector Controller 38 which employs a programmable memory (PROM) to actuate the switch selection 42. Since the coarse tuning control word 18 may cover the 2 GHz to 18 GHz with 1 MHz resolution, this word 18 is employed as the address to the PROM. The PROM is programmed to select the proper VCO and output frequency range via the RF switches SD1 . . . SDN dependent on the selection implicit in the coarse tuning control word 18.

The output signal 112 is also received by coupler 114 which delivers, by way of signal path 118, signal 112 to an amplifier 118 which, in turn, delivers the amplified signal 112 to a frequency multiplier 120. The frequency multiplier 120 multiplies the frequency of signal 112 by two and provides an output signal 122 having a frequency range as shown in FIG. 4, which is made available to switching element SD2 to serve as the RF output signal 106.

VCO 28 provides its output on signal path 32 carrying a signal 124 having a frequency range shown in FIG. 4 which, in turn, is delivered to a frequency multiplier 126. The frequency multiplier 126 multiplies the frequency of its received signal by a factor of two to provide a signal 128 having a frequency range shown in FIG. 4 which, in turn, is made available to serve as the RF output signal 106 by way of switching element SD2C. The signal 128 is delivered to coupler 130 which, in turn, delivers signal 128, by way of signal path 132 to an amplifier 134 which, in turn, delivers amplified signal 128 to a frequency multiplier 136. The frequency multiplier 136 multiplies the frequency of signal 128 by a factor of two to provide for an output signal 138 having a frequency range shown in FIG. 4 and which is made available to switching element SD2C to serve as the RF output signal 106.

A further embodiment 56 of the present invention that provides for RF output signals, may be further described with reference to FIG. 5. As seen in FIG. 5, the embodiment 56 includes the embodiment 54, but in addition thereto, includes a plurality of frequency dividers that are used to increase the range of available frequencies provided by the VCOs 26 and 28.

As seen in FIG. 5, the embodiment 56 includes couplers 140 and 142 which respectively receive signals 108 and 124 and deliver such by way of signals paths 144 and 146 to the switchable element SD3C. Switching element SD3C is controlled by switching device SD3, which is controlled by VCO selector controller 38, so as to switch between signal paths 144 and 146. The output from SD3C is routed, via signal path 146 to coupler 148.

Coupler 148 provides an output signal 150 having a frequency range shown in FIG. 4, which corresponds to the combined range of VCO 26 and VCO 28. Signal 150 is made available as an output signal by way of switching element SD4C indirectly controlled by VCO selector controller 38. The output of the coupler 148 is also delivered to a frequency divider 152 by way of signal path 154. The frequency divider 152, as well as the other frequency dividers shown in FIG. 5, divides the frequency of its received signal by two. The frequency divider 152 provides an output to coupler 156 which, in turn, provides for a signal 158 having a frequency range shown in FIG. 5 and which is made available as an output signal 106 by way of switching element SD5C. The output of coupler 156 is delivered to a frequency divider 160 by way of signal path 162. The frequency divider 160 delivers its output signal to a coupler 164 which, in turn, provides for a signal 166 having a frequency range shown in FIG. 5 which is made available as an output signal by way of switching element SD5C. The output of coupler 164 is delivered to a frequency divider 168, by way of signal path 170. The frequency divider 168 delivers its output to a coupler 172 that provides an output signal 174 having a frequency range shown in FIG. 5. The coupler 172 delivers its output to a frequency divider 176 by way of signal path 178 which, in turn, provides an output signal 178 having a frequency range shown in FIG. 5, which is made available as an output signal by way of switching element SD5C.

The switching element SD5C is illustrated as having a coupler 180, which represents the blanking position. More particularly, this position represents that the RF synthesizer 10 blanks (shuts off) the RF output 106 when the VCOs, that is, VCO 26 and 28 is in transition.

It should now be appreciated that the practice of the present invention provides an RF output signal having a having a frequency range of between 150 MHz to 18 GHz.

The practice of the invention of the RF synthesizer provides a frequency which can be tuned within 150 µS, to an accuracy of 0.0001%RMS. It is contemplated that by trading frequency accuracy for acquisition time, an accuracy of 10 MHz can be provided with an acquisition time of 10 microseconds. It is further contemplated that the practice of the present invention can extend its frequency range from about 140.625 MHz to 18 GHz capability.

Obviously, many modifications and variations of the present invention are possible in light of the foregoing teachings. It is therefore, to be understood that within the scope of the independent claims of the invention may be practiced as otherwise described.

What I claim is:

1. A digitally tuned synthesizer comprising:
   a) register means for receiving a digital word having a predetermined number of bits;
   b) means interconnected to said register means for partitioning said predetermined number of bits of said digital word into coarse and fine control words;
   c) a first digital to analog converter connected to said coarse control word and providing an output representative of said coarse control word;
   d) at least one voltage controlled oscillator having first and second inputs with the first input connected to said output of said first digital to analog converter and providing a RF output representative of its first and second inputs;
   e) a frequency measurement circuit connected to the output of said at least one voltage controlled oscillator and providing an output representative thereof;
   f) a first adder having plus (+) and minus (−) inputs, said plus (+) input being connected to said fine control word, said minus (−) input being connected to said output of said frequency measuring circuit, said first adder having an output representative of the difference between its inputs; and
   g) a second digital to analog converter connected to said output of said first adder and providing an output representative thereof that is connected said second input of said at least one voltage controlled oscillator.

2. The digitally tuned synthesizer according to claim 1, wherein said at least one voltage controlled oscillator comprises first and second voltage controlled oscillators each having first and second inputs respectively connected to the outputs of said first and second analog to digital converters and wherein said digitally tuned synthesizer further comprises:
   a voltage controlled oscillator (VCO) selector control circuit having an input connected to said input of word and providing an output when said coarse control word is less than a predetermined quantity, and at least one switching device connected to said output of said VCO selector circuit and having open and closed states and connected to the outputs of said first and second voltage controlled oscillators, said closed state being connected to said output of said first voltage controlled oscillator and said open state being connected to said output of said second voltage controlled oscillator, said at least one switching device being responsive to said output of said VCO selector circuit so as transition said closed state to an open state and said open state to a closed state.

3. The digitally tuned synthesizer according to claim 2, wherein said first voltage controlled oscillator has a frequency band from about 2.25 GHz to about 3.2 GHz and said second voltage controlled oscillator has a frequency band from about 3.1 GHz to about 4.5 GHz.

4. The digitally tuned synthesizer according to claim 3 further comprising a series of frequency multipliers and frequency dividers selectively connected to the outputs of said first and second voltage controlled oscillators so as to provide RF signals in the range from about 17 MHz to about 18 GHz.

5. The digitally tuned synthesizer according to claim 1, wherein said frequency measurement circuit comprises a correlator having a signal of interest that is compared against said signal of interest delayed by a predetermined duration that is established by a clock, said correlator delivering an output representative of the output of the frequency measurement circuit and which is proportional to the correspondence between the signal of interest and the signal of interest delayed by said predetermined duration.

6. The digitally tuned oscillator according to claim 5, wherein said frequency measurement circuit comprises:
   a) a frequency division circuit having an input connected to the output of said at least one voltage controlled oscillator and providing an output representative thereof;
   b) a filter connected to the output of said frequency division circuit and providing a sinusoid output representative thereof;
   c) a quadrature hybrid connected to said sinusoid output of said filter and providing first and second outputs respectively representative of in-phase (I) and quadrature (Q) components;
   d) a dual analog to digital converter responsive to a clock signal with a predetermined frequency and having first and second inputs respectively connected to said in-phase (I) components and said quadrature (Q) components, said dual analog to digital converter providing first and second digital outputs respectively representative of said in-phase (I) and quadrature (Q) components;
   e) a phase split PROM having first and second inputs respectively connected to said digital outputs representative of said in-phase (I) and quadrature (Q) components and providing an output signal representative of the inverse tangent of the ratio of the in-phase (I) and quadrature (Q) components, said output signal of said phase split PROM comprising said signal of interest;
   f) a clock delay circuit receiving said signal of interest and delaying it by said predetermined duration; and
   g) a second adder having positive (+) and minus (−) inputs, respectively connected to said signal of interest and said signal of interest delayed by said predetermined duration, said second adder having an output comprising said output of said frequency measurement circuit and representative of the difference between the inputs of said second adder.

7. The digitally tuned oscillator according to claim 6, wherein said frequency division circuit comprises a circuit that divides the output of said at least one voltage controlled oscillator by about 128.

8. The digitally tuned oscillator according to claim 7, wherein said filter has a pass band in the range from about 17 MHz to about 36 MHz.

9. The digitally tuned oscillator according to claim 8, wherein said predetermined frequency of clock signal for said dual analog to digital converter is about 64 MHz.

10. The digitally tuned oscillator according to claim 9, wherein predetermined duration of said clock delay circuit is about 1 MHz.

11. The digitally tuned oscillator according to claim 1 further comprising an integrator interposed between the output of said first added and the input of said second digital to analog converter.

* * * * *